United States Patent
Jeong et al.

(10) Patent No.: US 8,183,613 B2
(45) Date of Patent: May 22, 2012

(54) BIPOLAR TRANSISTOR FOR A MEMORY ARRAY

(75) Inventors: Hoon Jeong, Hwaseong-si (KR);
Yong-Chul Oh, Suwon-si (KR);
Sung-In Hong, Seoul (KR);
Sung-Hwan Kim, Suwon-si (KR);
Yong-Lack Choi, Seoul (KR); Ho-Ju Song, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 105 days.

(21) Appl. No.: 12/683,179

(22) Filed: Jan. 6, 2010

(65) Prior Publication Data
US 2010/0176451 A1    Jul. 15, 2010

(30) Foreign Application Priority Data
Jan. 9, 2009    (KR) .................. 10-2009-0001838

(51) Int. Cl.
*H01L 27/108* (2006.01)

(52) U.S. Cl. ......... 257/302; 257/E27.075; 257/E27.078; 438/259

(58) Field of Classification Search .................. 257/135, 257/278, 242, 302, 314, 316, E27.075–E27.078; 438/156, 157, 241, 257, 259
See application file for complete search history.

(56) References Cited

U.S. PATENT DOCUMENTS

| | | | |
|---|---|---|---|
| 5,308,776 A * | 5/1994 | Gotou | 438/311 |
| 5,448,513 A | 9/1995 | Hu et al. | |
| 6,472,258 B1 * | 10/2002 | Adkisson et al. | 438/192 |
| 6,504,201 B1 * | 1/2003 | Noble et al. | 257/302 |
| 6,566,682 B2 * | 5/2003 | Forbes | 257/51 |
| 6,838,723 B2 * | 1/2005 | Forbes | 257/301 |
| 6,940,761 B2 * | 9/2005 | Forbes | 365/189.09 |
| 6,956,256 B2 * | 10/2005 | Forbes | 257/278 |
| 7,149,109 B2 * | 12/2006 | Forbes | 365/174 |
| 7,528,440 B2 * | 5/2009 | Forbes | 257/329 |
| 7,772,633 B2 * | 8/2010 | Juengling | 257/302 |
| 2006/0046407 A1 * | 3/2006 | Juengling | 438/301 |
| 2008/0061346 A1 * | 3/2008 | Tang et al. | 257/314 |
| 2010/0061145 A1 * | 3/2010 | Weis | 365/163 |

* cited by examiner

*Primary Examiner* — Thao Le
*Assistant Examiner* — William F Kraig
(74) *Attorney, Agent, or Firm* — F. Chau & Associates, LLC

(57) ABSTRACT

A memory device includes an insulation layer, an active pattern, a gate insulation layer and a gate electrode. The insulation layer is formed on a substrate. The active pattern is formed on the insulation layer, and includes two protrusions and a recess between the protrusions. The active pattern includes a first impurity region and a second impurity region at upper portions of the protrusions distal from the substrate, respectively, and a base region at the other portions serving as a floating body for storing data. The gate insulation layer is formed on a surface of the active pattern. The gate electrode is formed on the gate insulation layer, and surrounds a lower portion of the active pattern and partially fills the recess.

11 Claims, 10 Drawing Sheets

BIPOLAR TRANSISTOR FOR A MEMORY ARRAY

CROSS-REFERENCE TO RELATED APPLICATION

This application claims under 35 USC §119 priority to and the benefit of Korean Patent Application No. 2009-0001838, filed on Jan. 9, 2009 in the Korean Intellectual Property Office (KIPO), the entire content of which is incorporated by reference herein.

BACKGROUND

1. Technical Field

The present disclosure relates to semiconductor devices and a method of manufacturing the same, and, more particularly, to a one-transistor dynamic random access memory (1T-DRAM) device and a method of manufacturing the same.

2. Discussion of the Related Art

Recently, 1T-DRAM devices having a unit cell of a transistor without a capacitor have been developed. Particularly, 3-dimensional 1T-DRAM devices having a high degree of integration and good data retention characteristics have been studied. However, when the 1T-DRAM devices have a high degree of integration, the 1T-DRAM devices may not have good data retention characteristics because a floating body for storing data may have a small area. Thus, the 1T-DRAM devices may not have both of the high degree of integration and the good data retention characteristics.

SUMMARY

Exemplary embodiments of the present inventive concept provide a 1T-DRAM device having good electrical characteristics.

Exemplary embodiments of the present inventive concept also provide a method of manufacturing a 1T-DRAM device having good electrical characteristics.

According to an exemplary embodiment, a memory device includes an insulation layer on a substrate. An active pattern is on the insulation layer, the active pattern including two protrusions and a recess between the protrusions. The active pattern includes a first impurity region and a second impurity region at upper portions of the protrusions distal from the substrate, respectively. A base region is at other portions of the active pattern, the base region serving as a floating body for storing data. A gate insulation layer is on a surface of the active pattern. A gate electrode is on the gate insulation layer, the gate electrode surrounding a lower portion of the active pattern and partially filling the recess.

The first impurity region and the second impurity region may be doped with first conductive type impurities and the base region is doped with second conductive type impurities.

The base region may serve as a base of a bipolar transistor. The first impurity region may serve as an emitter of the bipolar transistor. The second impurity region may serve as a collector of the bipolar transistor.

A first voltage may be applied to the base region via the gate electrode and a second voltage may be applied to the second impurity region to store data in the base region.

An erase voltage may be applied to the base region via the gate electrode and a second voltage may be applied to the second impurity region to erase data stored in the base region.

A first voltage may be applied to the base region via the gate electrode and a second voltage may applied to the second impurity region to store data in the base region, and current flowing through the second impurity region serving as a collector may be detected to read data stored in the base region.

The gate electrode may have a top surface closer to the substrate than bottoms of the first impurity region and the second impurity region are to the substrate.

The active pattern may include a single crystalline semiconductor.

A plurality of the active patterns may be formed on the insulation layer, and the gate electrode may surround lower portions of the active patterns disposed in a first direction.

A bit line may be electrically connected to a plurality of the first impurity regions disposed in a second direction perpendicular to the first direction.

A source line may be electrically connected to a plurality of the second impurity regions disposed in the first direction.

A word line may be electrically connected to a plurality of base regions disposed in the first direction.

According to an exemplary embodiment method of manufacturing a memory device includes forming an insulation layer on a substrate, forming an active pattern on the insulation layer, the active pattern including two protrusions and a recess between the protrusions, forming a gate insulation layer on a surface of the active pattern, forming a gate electrode on the gate insulation layer, the gate electrode surrounding a lower portion of the active pattern and partially filling the recess, and implanting impurities into upper portions of the protrusions distal from the substrate to form a first impurity region and a second impurity region, respectively.

The first impurity region and the second impurity region may be formed to have bottoms further from the substrate than a top surface of the gate electrode is from the substrate.

The upper portions of the protrusions distal from the substrate may serve as a respective emitter and collector of a bipolar transistor. The other portion of each active pattern may serve as a base of the bipolar transistor and functions as a floating body, and forming an active pattern may further include controlling widths and/or heights of the protrusions to control the volume of the floating body in which charges are stored.

The method of manufacturing may further include foaming contact plugs on the respective emitter and collector, forming a bit line on a contact plug of the emitter, and forming a source line on a contact plug of the collector, the gate electrode serving as a word line.

According to an exemplary embodiment a method of storing data includes forming a memory device having an insulation layer on a substrate, an active pattern on the insulation layer, the active pattern including two protrusions and a recess between the protrusions, the active pattern including a first impurity region and a second impurity region at upper portions of the protrusions distal from the substrate, respectively and a base region at other portions of the protrusions, the base region serving as a floating body for storing data. A gate insulation layer is on a surface of the active pattern. A gate electrode is on the gate insulation layer, the gate electrode surrounding a lower portion of the active pattern and partially filling the recess. The first impurity region and the second impurity region are doped with first conductive type impurities and the base region is doped with second conductive type impurities. A portion of the active pattern beneath the first impurity region and the second impurity region serves as a base of a bipolar transistor. The first impurity region serves as an emitter of the bipolar transistor. The second impurity region serves as a collector of the bipolar transistor. A first voltage is applied to the base via the gate electrode and a second voltage is applied to the collector to store data in the base region.

BRIEF DESCRIPTION OF THE DRAWINGS

Exemplary embodiments will be more clearly understood from the following detailed description taken in conjunction with the accompanying drawings.

FIG. 1 is a perspective view illustrating a unit cell of a 1T-DRAM device in accordance with an exemplary embodiments;

FIG. 2 is a cross-sectional view cut along the line I-I' in FIG. 1;

FIG. 3 is a perspective view illustrating a 1T-DRAM having unit cell arrays in accordance with an exemplary embodiment;

FIG. 4 is an equivalent circuit diagram of the 1T-DRAM in FIG. 3; and

FIGS. 5, 6, 7, 8, 9, 10, 11, 12, 13, 14, 15, 16 and 17 are cross-sectional views illustrating a method of manufacturing a 1T-DRAM device in accordance with an exemplary embodiment.

DETAILED DESCRIPTION OF THE EMBODIMENTS

Figure 1:
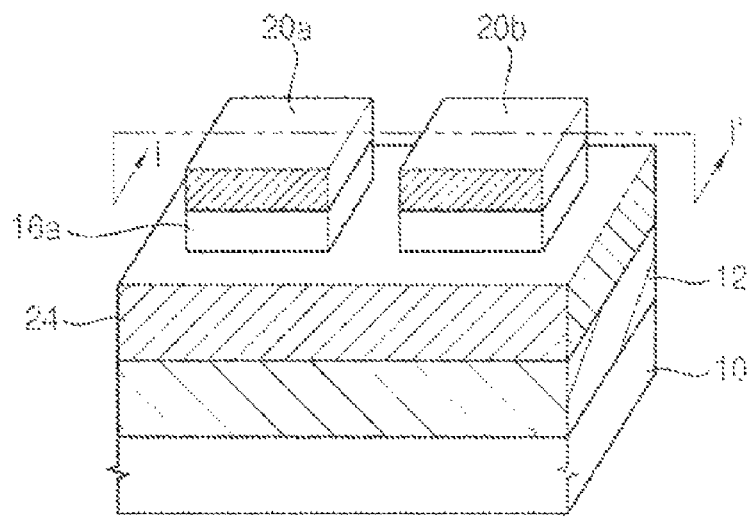
FIGS. 1 to 17 represent non-limiting, exemplary embodiments as described herein. Like numerals refer to like elements throughout.

Various exemplary embodiments will be described more fully hereinafter with reference to the accompanying drawings, in which exemplary embodiments are shown. The present inventive concept may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Figure 2:
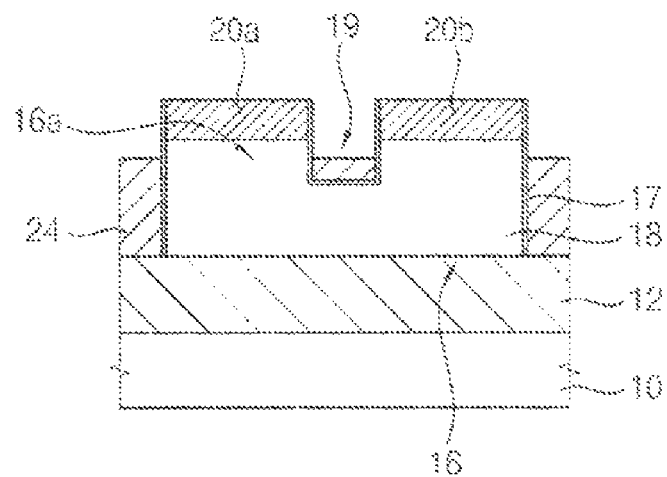

FIG. 1 is a perspective view illustrating a unit cell of a 1T-DRAM device in accordance with an exemplary embodiment. FIG. 2 is a cross-sectional view cut along the line I-I' in FIG. 1.

Referring to FIGS. 1 and 2, an insulation layer 12 may be formed on a substrate 10. The substrate 10 may include a semiconductor substrate such as a silicon substrate, a germanium substrate, a silicon-germanium substrate, and the like. The insulation layer 12 may include an oxide. For example, the insulation layer 12 may include silicon oxide.

An active pattern 16 may be framed on the insulation layer 12. The active pattern 16 may have protrusions, e.g., two protrusions 16a at upper portions thereof and a recess 19 between the protrusions 16a. Each of the protrusions 16a may have a flat top surface.

In an exemplary embodiment, the protrusions 16a may be formed at edge top portions of the active pattern 16. Thus, the active pattern 16 may have a U-shape.

Alternatively, the protrusions 16a may be formed at central top portions of the active pattern 16.

The active pattern 16 may serve as a floating body for storing charges. The floating body may be enlarged by controlling the volume or the position of the protrusions 16a. For example, when the protrusions 16a have a higher top surface, the active pattern 16 may have a larger volume so that more charges may be stored therein.

First and second impurity regions 20a, 20b may be formed at upper portions of the protrusions distal from the substrate 16a. The first and second impurity regions 20a, 20b may be heavily doped with n-type impurities.

The first impurity region 20a may serve as an emitter of a bipolar transistor, and the second impurity region 20b may serve as a collector of the bipolar transistor. A portion 18 of the active pattern 16 beneath the first and second impurity regions 20a, 20b may serve as a base of the bipolar transistor, and may be called a base region 18 of the active pattern 16. Thus, the active pattern 16 including the first and second impurity regions 20a, 20b and the base region 18 may serve as the bipolar transistor.

A gate insulation layer 17 may be formed on a surface of the active pattern 16 except for top and bottom surfaces thereof. The gate insulation layer 17 may include silicon oxide.

A gate electrode 24 may be formed on the insulation layer 12 to partially cover the active pattern 16. Particularly, the gate electrode 24 may be formed on the insulation layer 12 and on the gate insulation layer 17 to surround a lower portion of the active pattern 16, and further partially fill the recess 19. Thus, the base region 18 facing the gate electrode 24 may be increased when compared to other base regions having a fin shape or a pillar shape, thereby increasing the gate capacitance. The gate electrode 24 may have a top surface lower than a bottom of the impurity regions 20a, 20b, so that the gate electrode 24 does not overlap the impurity regions 20a, 20b.

The gate electrode 24 may face the base region 18, and thus a voltage applied to the gate electrode 24 may be transferred to the active pattern 16.

The operation of writing data in the 1T-DRAM device of FIGS. 1 and 2 will now be explained.

When an emitter and a base are forward biased and the base and a collector are reverse biased, a bipolar current may flow from the emitter to the base. Thus, when the first impurity region 20a and the base region 18 are forward biased and the base region 18 and the second impurity region 20*b* are reverse biased, a bipolar current may be generated. When the bipolar current flows, impact ionization may occur at an interface between the second impurity region 20*b* and the base region 18, thereby generating a plurality of majority carriers. The majority carriers may be stored in the base region 18.

The majority carriers stored in the base region 18 may be removed by applying erase voltages to the base region 18 and the second impurity region 20*b*.

As described above, data may be written in the 1T-DRAM device by storing charges in the base region 18 or by removing charges from the base region 18.

The operation of reading data in the 1T-DRAM device of FIGS. 1 and 2 will now be explained.

When charges are stored in the base region 18, a bipolar current higher than a channel current may flow. Thus, a current flowing through the second impurity region 20*b* serving as the collector may be detected via a detection circuit electrically connected to the second impurity region 20*b*, so that data stored in the base region 18 may be read.

The active pattern 16 of the 1T-DRAM device in accordance with an exemplary embodiment may have protrusions 16*a*, and the gate electrode 24 may surround a lower portion of the base region 18 and a lower portion of the protrusions 16*a*. Thus, the area of the gate electrode 24 facing the active pattern 16 may be increased. Additionally, the gate electrode 24 may have a good capacity of controlling charges in the active pattern 16 as well as having a high gate capacitance.

However, a fin type memory device having a fin active pattern may have a high gate capacitance when the fin active pattern has a large height, which may generate defects of a gate electrode subsequently formed. Additionally, a pillar type memory device having a pillar active pattern may have a high gate capacitance when the pillar active pattern has a large height or a large diameter, which may generate mis-operation of the memory device because of a long channel length, or may deteriorate the integration degree.

Thus, when compared to the fin type memory device or the pillar type memory device, the 1T-DRAM device in accordance with an exemplary embodiment may have a good gate capacitance, a good capacity of channel control, and a high integration degree. Further, the 1T-DRAM device may have good data retention characteristics and good refresh characteristics by increasing the volume of the active pattern 16 in which the majority carriers are stored.

Figure 3:
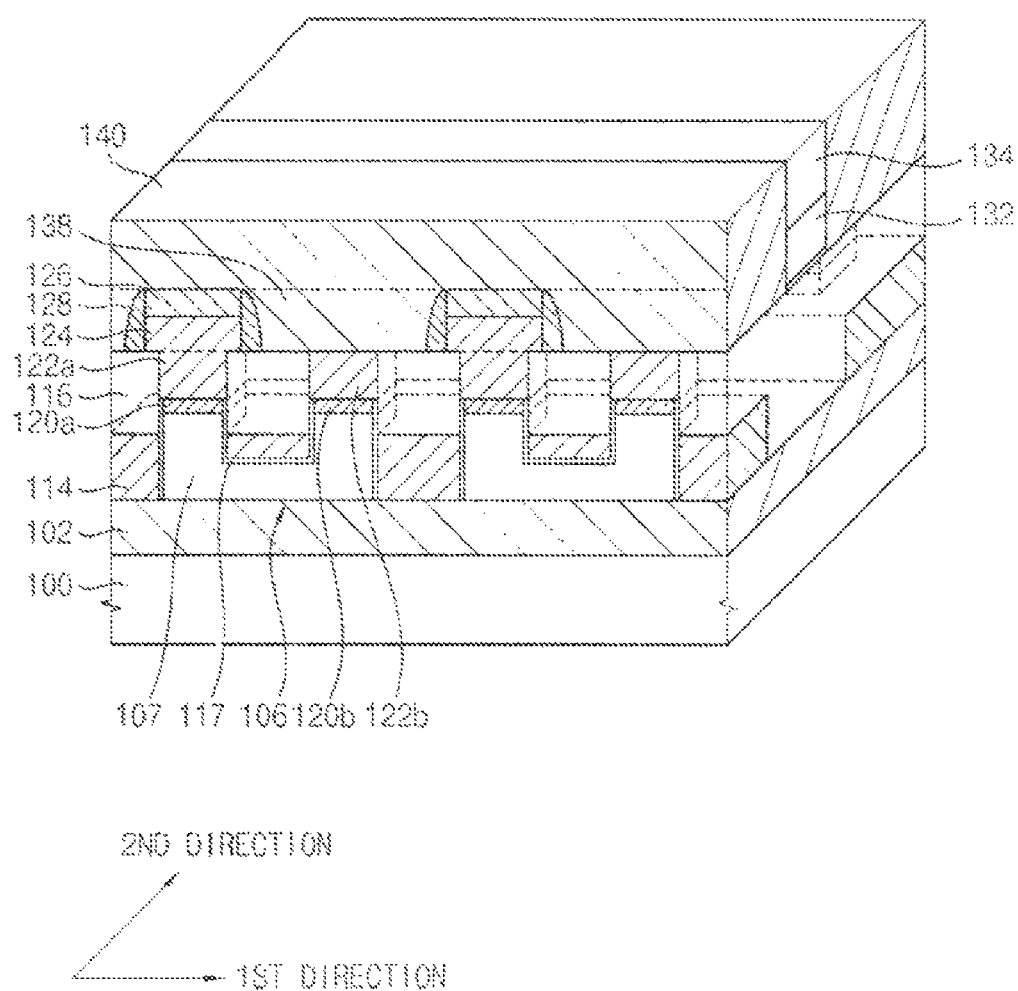
Figure 4:
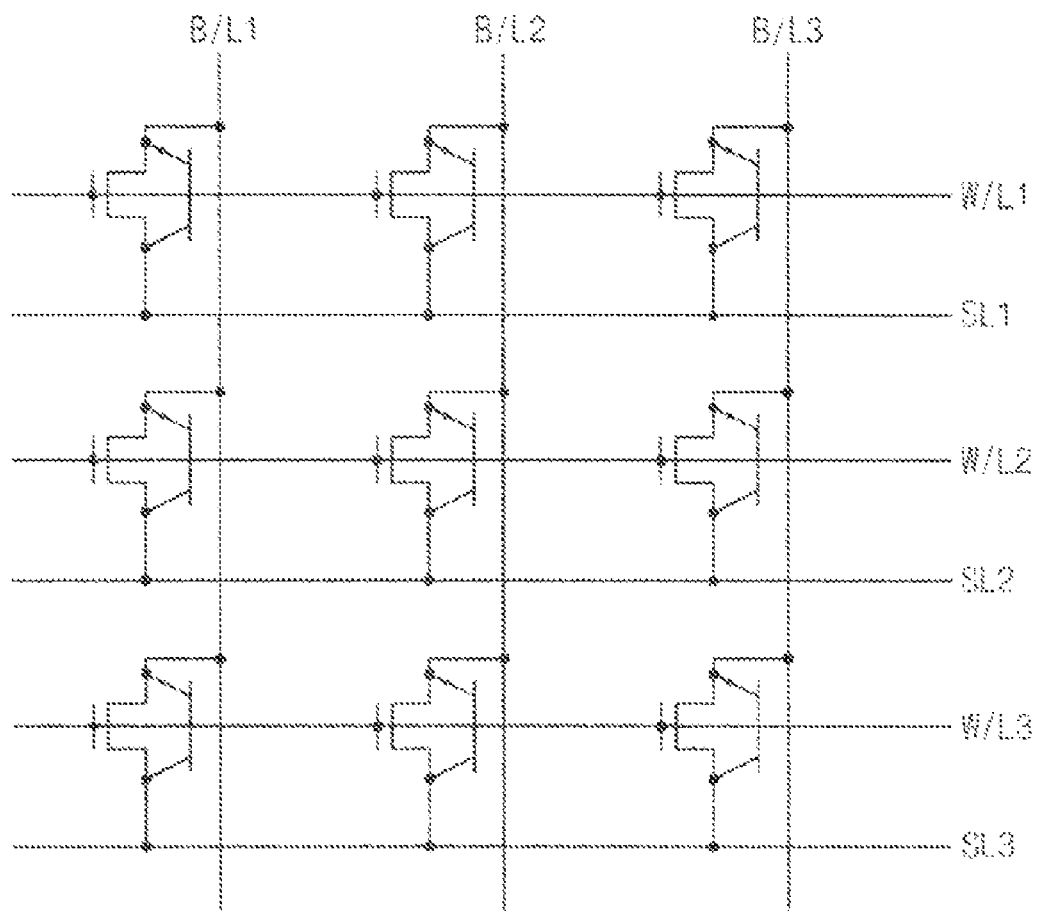

FIG. 3 is a perspective view illustrating a 1T-DRAM having unit cell arrays in accordance with an exemplary embodiment. FIG. 4 is an equivalent circuit diagram of the 1T-DRAM in FIG. 3.

Referring to FIG. 3, an insulation layer 102 may be formed on a substrate 100.

A plurality of active patterns 106 each of which is substantially the same as that of FIG. 1 may be formed on the insulation layer 102. Particularly, a first impurity region 120*a* serving as an emitter, a second impurity region 120*b* serving as a collector may be formed at upper portions of each active pattern 106. Additionally, a base region 107 may be formed beneath the first and second impurity regions 120*a*, 120*b* in each active pattern 106. The base region 107 may be doped with p-type impurities. Each active pattern 106 having the first and second impurity regions 120*a*, 120*b* and the base region 107 may serve as a bipolar transistor. Each active pattern 106 may have protrusions at upper portions thereof and a recess between the protrusions.

A gate insulation layer 117 may be formed on a surface of each active pattern 106 except for top and bottom surfaces thereof. The gate insulation layer 117 may include silicon oxide.

A gate electrode 114 may be formed on the gate insulation layer 117 to partially cover the active patterns 106. Particularly, the gate electrode 114 may be formed on the insulation layer 102 and on the gate insulation layer 117 to surround lower portions of the active patterns 106, and further partially fill the recesses. The gate electrode 114 may have a top surface lower than a bottom of the impurity regions 120*a*, 120*b*, so that the gate electrode 114 does not overlap the impurity regions 120*a*, 120*b*. The gate electrode 114 may extend in a first (1ST) direction.

A first insulating interlayer 116 may be formed on the gate electrode 114 and the insulation layer 102 to cover the active patterns 106 except for the impurity regions 120*a*, 120*b*.

A first contact plug 122*a* and a second contact plug 122*b* may be formed on the first and second impurity regions 120*a*, 120*b*, respectively. The first and second contact plugs 122*a*, 122*b* may include a metal or doped polysilicon.

A plurality of bit lines 124 may be formed on the first contact plugs 122*a* and the first insulating interlayer 116 to electrically connect the first contact plugs 122*a* to each other, which are disposed in a second (2ND) direction perpendicular to the first direction. The bit lines 124 may include a metal or doped polysilicon.

A plurality of hard masks 126 may be formed on the bit lines 124. Spacers 128 may be formed on sidewalls of the bit lines 124 and the hard masks 126.

A second insulating interlayer 132 may be formed on the first insulating interlayer 116, the hard masks 126 and the spacers 128 to extend in the first direction. The second insulating interlayer 132 may overlap central portions of the bit lines 124. Additionally, a third insulating interlayer 134 may be foamed on the second insulating interlayer 132.

A plurality of source contact plugs 138 may be formed on the second contact plugs 122*b* and the first insulating interlayer 116 to fill spaces between the spacers 128. In exemplary embodiments, the source contact plugs 138 may have a height substantially the same as that of the second insulating interlayer 132.

A plurality of source lines 140 may be formed on the source contact plugs 138 and the hard masks 126. The source lines 140 may have a height substantially the same as that of the third insulating interlayer 134.

In an exemplary embodiment, the source contact plugs 138 and the source lines 140 may be formed integrally.

Referring to FIGS. 3 and 4, each of bit lines B/L1, B/L2, B/L3 may be connected to the first impurity regions 120*a* that are disposed in the second direction and serve as the emitter. The gate electrodes 114 contacting the base regions 107 that are disposed in the first direction may serve as word lines W/L1, W/L2, W/L3, respectively. Each of source lines SL1, SL2, SL3 may be connected to the second impurity regions 120*b* that are disposed in the first direction and serve as the collector. Each base region 107 may serve as a floating body of each bipolar transistor, and data may be stored when charges are stored in the floating body.

FIGS. 5 to 17 are cross-sectional views illustrating a method of manufacturing a 1T-DRAM device in accordance with an exemplary embodiment.

Figure 5:
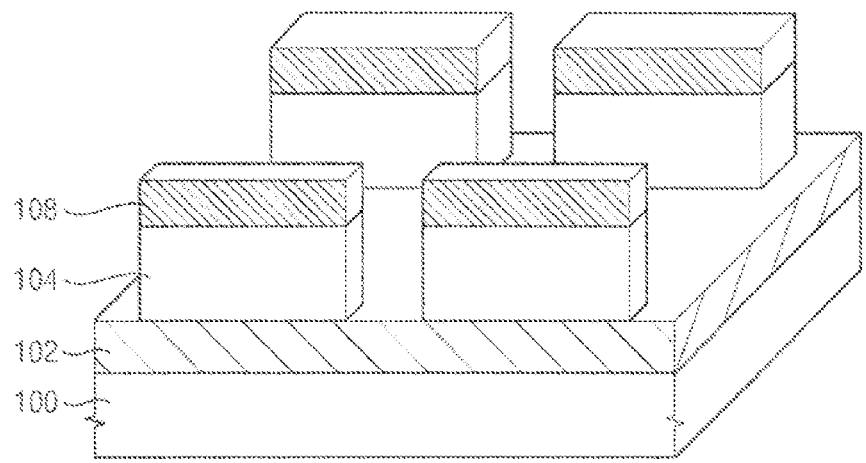

Referring to FIG. 5, a silicon-on-insulator (SOI) substrate including a bulk silicon substrate 100, an insulation layer 102 and a silicon layer sequentially stacked may be provided. The silicon layer may include single crystalline silicon.

A plurality of first hard masks 108 may be formed on the silicon layer. The first hard masks 108 may be formed using a nitride.

Heights of contact plugs 122a, 122b (see FIG. 12) may depend on those of the first hard masks 108, and thus the first hard masks 108 may be formed to have heights equal to or larger than those of the contact plugs 122a, 122b.

The silicon layer may be etched using the first hard masks 108 as an etching mask to form a plurality of active layers 104 on the insulation layer 102. That is, the active layers 104 may be formed using single crystalline silicon.

Figure 6:
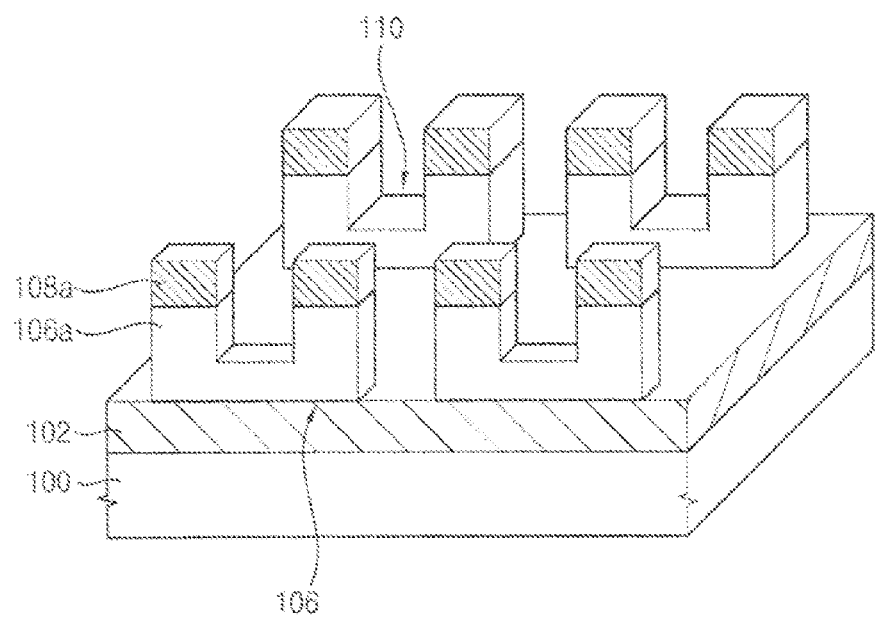

Referring to FIG. 6, a first photoresist pattern (not shown) may be formed on the first hard masks 108. The first photoresist pattern may expose central upper surfaces of the first hard masks 108.

The first hard masks 108 may be etched using the first photoresist pattern as an etching mask to form a plurality of second hard masks 108a. The active layers 104 may be partially etched using the second hard masks 108a as an etching mask to form recesses 110 at upper portions of the active layers 104. Thus, a plurality of active patterns 106, each of which includes e.g., two protrusions 106a and the recess 110 between the protrusions 106a, may be formed.

Upper portions of the protrusions 106a distal from the substrate of each active pattern 106 may serve as an emitter and a collector of a bipolar transistor. The other portion of each active pattern 106 may serve as a base of the bipolar transistor and function as a floating body. Thus, by controlling the volume of the active patterns 106, e.g., by controlling widths and/or heights of the protrusions 106a, the volume of the floating body in which charges are stored may be controlled.

Figure 7:
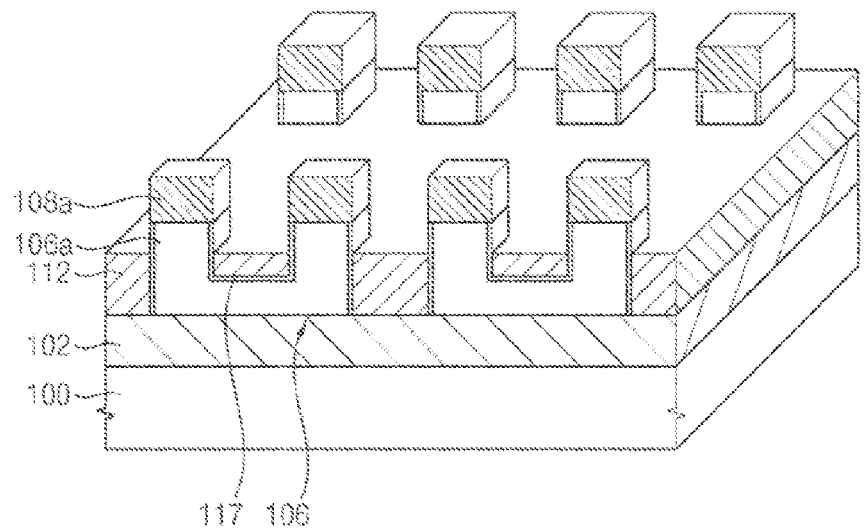

Referring to FIG. 7, a gate insulation layer 117 may be fanned on surfaces of the active patterns 106 except for top and bottom surfaces thereof. The gate insulation layer 117 may be formed by thermally oxidizing the surfaces of the active patterns 106.

A first conductive layer 112 may be formed on the insulation layer 102 to cover the second hard masks 108a. The first conductive layer 112 may be formed using polysilicon doped with n-type impurities. Alternatively, the first conductive layer 112 may be formed using a metal, or polysilicon and a metal silicide.

An upper portion of the first conductive layer 112 may be planarized until the second hard masks 108a are exposed. An upper portion of the planarized first conductive layer 112 may be etched until sidewalls of the protrusions 106a are exposed. Thus, the first conductive layer 112 may have a top surface lower than those of the protrusions 106a. The first conductive layer 112 may partially fill the recesses 110.

Figure 8:
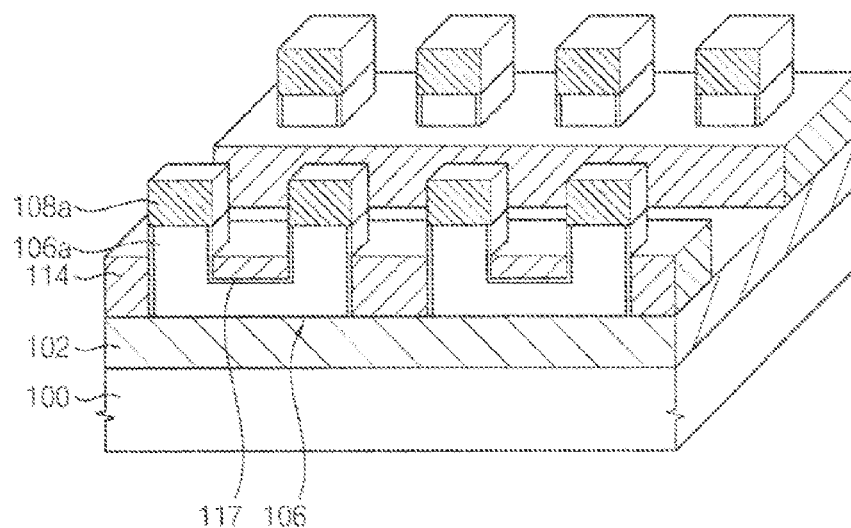
Figure 8:

Referring to FIG. 8, a photoresist layer (not shown) may be formed on the first conductive layer 112. The photoresist layer may be patterned to form a second photoresist pattern (not shown) extending in the first direction. The second photoresist pattern may cover the active patterns 106.

The first conductive layer 112 may be etched using the second photoresist pattern as an etching mask to form gate electrodes 114 each of which extends in the first direction. Each gate electrode 114 may have a width in the second direction larger than that of each active pattern 106.

Figure 9:
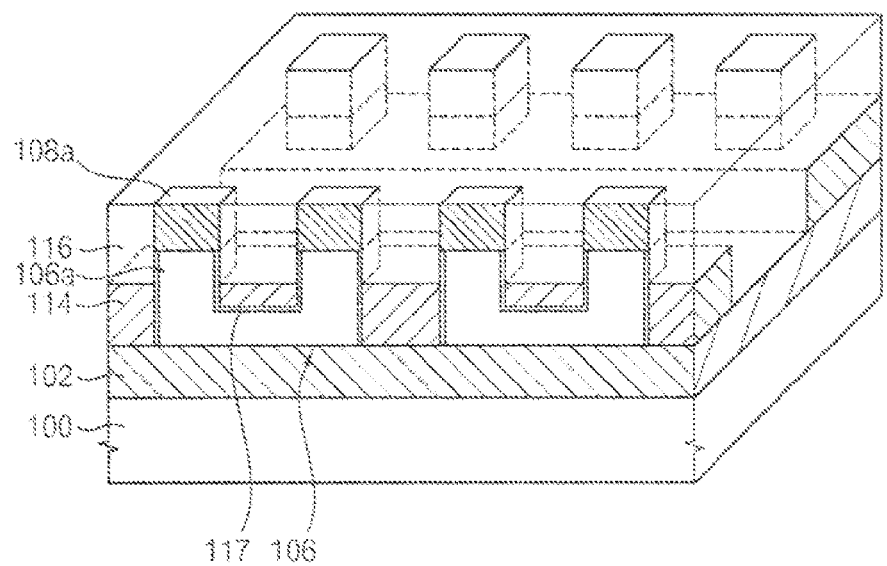

Referring to FIG. 9, a first insulating interlayer 116 may be formed on the insulation layer 102 and the gate electrodes 114 to cover the second hard masks 108a and the active patterns 106. The first insulating interlayer 116 may be formed using silicon oxide by a chemical vapor deposition (CVD) process.

An upper portion of the first insulating interlayer 116 may be planarized until the second hard masks 108a are exposed.

Figure 10:
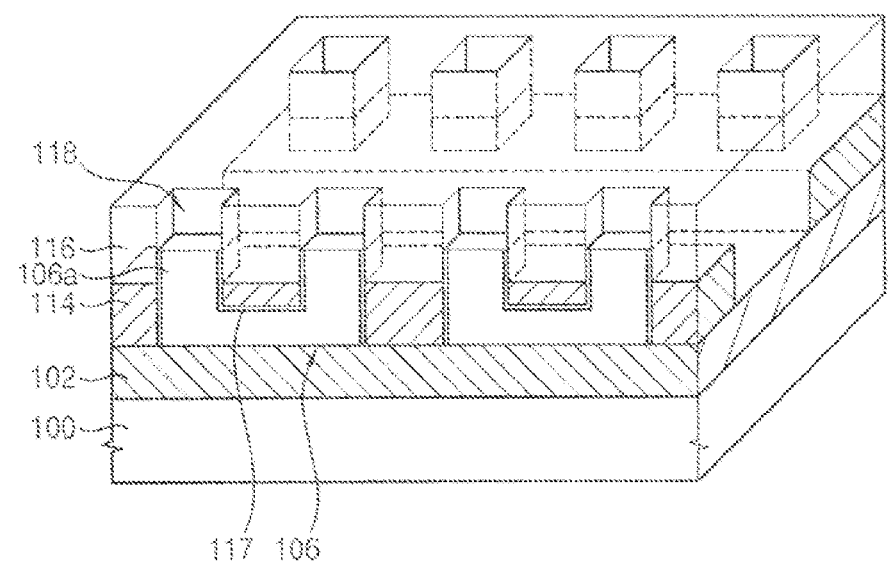

Referring to FIG. 10, the second hard masks 108a may be removed to form contact holes 118 exposing the protrusions 106a of the active patterns 106. The second hard masks 108a may be removed by a wet etching process.

Figure 11:
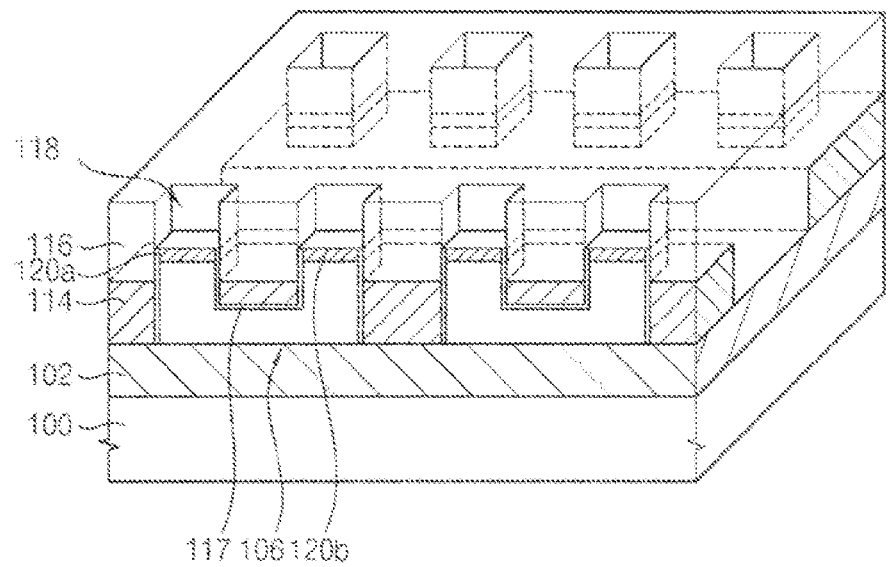

Referring to FIG. 11, impurities may be implanted into upper portions of the protrusions distal from the substrate 106a to form first and second impurity regions 120a, 120b. That is, the first impurity region 120a may be formed at one upper portion of each active pattern 106, and the second impurity region 120b may be formed at the other upper portion of each active pattern 106. The first impurity region 120a may serve as an emitter of a bipolar transistor, and the second impurity region 120b may serve as a collector of the bipolar transistor.

The first and second impurity regions 120a, 120b may be formed to have bottoms higher than top surfaces of the gate electrodes 114.

Figure 12:
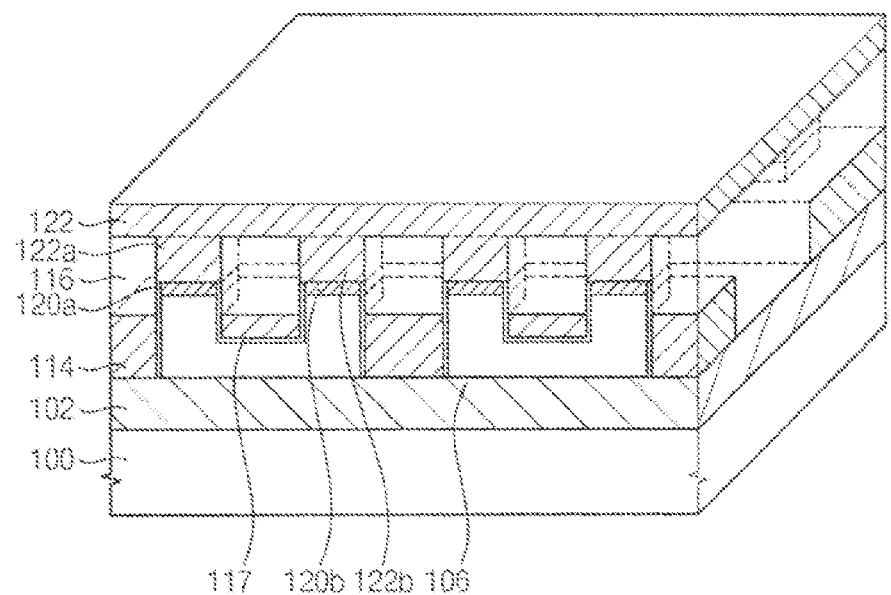

Referring to FIG. 12, a second conductive layer 122 may be formed on the first insulating interlayer 116 to fill the contact holes 118. The second conductive layer 122 may be formed using a metal.

Portions of the second conductive layer 112 filling the contact holes 118 may be called as the contact plugs 122a, 122b. Particularly, portions of the second conductive layer 112 contacting the first impurity regions 120a may be called as the first contact plugs 122a, and portions of the second conductive layer 112 contacting the second impurity regions 120b may be called as the second contact plugs 122b.

Figure 13:
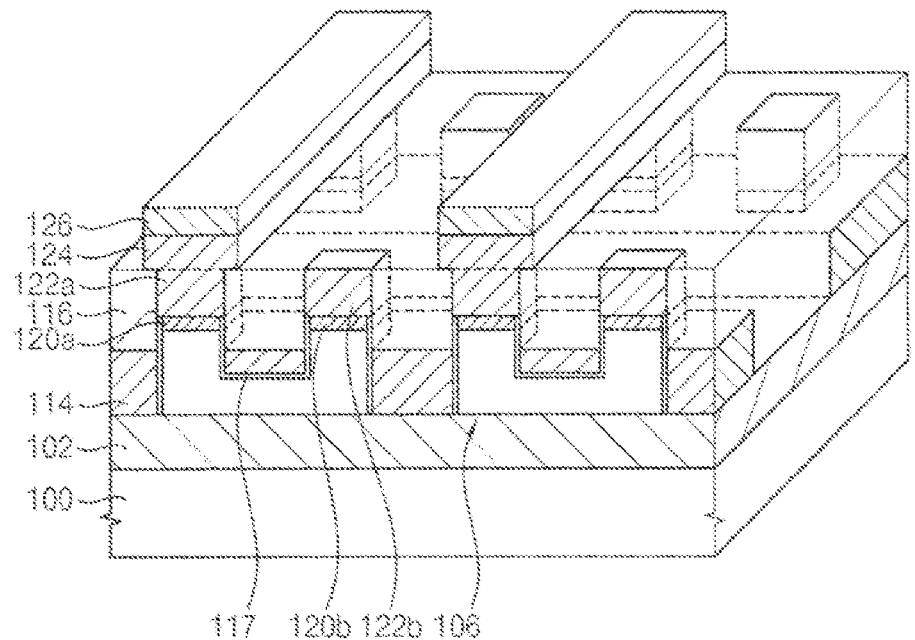

Referring to FIG. 13, third hard masks 126 may be formed on the second conductive layer 122. The third hard masks 126 may be formed using silicon nitride by performing a CVD process and a patterning process. Each third hard mask 126 may be formed to extend in the second direction and overlap the first contact plugs 122a.

The second conductive layer 122 may be etched using the third hard masks 126 as an etching mask to form a plurality of bit lines 124 each of which extends in the second direction and contacts the first contact plugs 122a.

Figure 14:
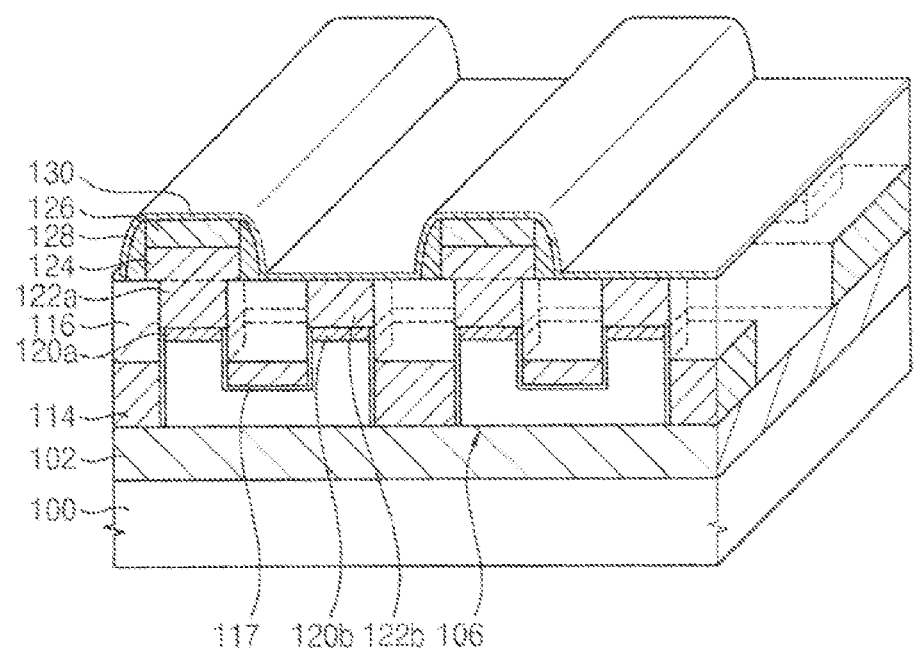

Referring to FIG. 14, a spacer layer may be formed on the first insulating interlayer 116 and the first and second contact plugs 122a, 122b to cover the third hard masks 126 and the bit lines 124. The spacer layer may be formed using silicon nitride. The spacer layer may be anisotropically etched to form spacers 128 on sidewalls of the bit lines 124 and the third hard masks 126.

An etch stop layer 130 may be formed on the third hard masks 126, the spacers 128, the first insulating interlayer 116 and the first and second contact plugs 122a, 122b. The etch stop layer 130 may be formed using silicon nitride.

Figure 15:
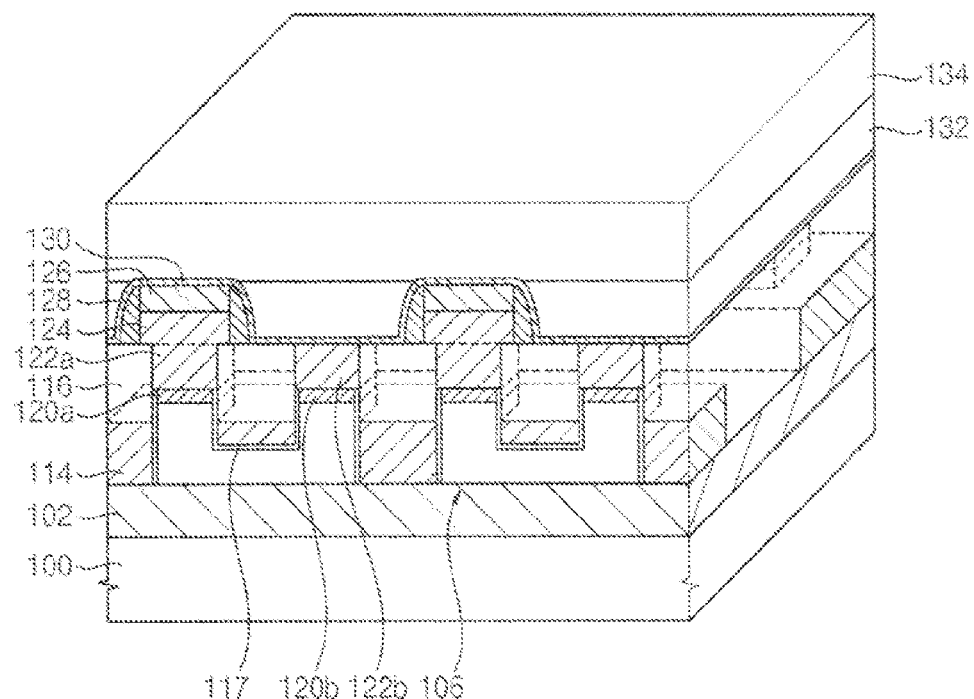

Referring to FIG. 15, a second insulating interlayer 132 may be formed on the etch stop layer 130 to fill spaces between the spacers 128. The second insulating interlayer 132 may be formed using silicon oxide. An upper portion of the second insulating interlayer 132 may be planarized until portions of the etch stop layer 130 on the third hard masks 126 are exposed. Thus, a plurality of second insulating interlayer 132 each of which extends in the second direction may be formed. A third insulating interlayer 134 may be formed on the second insulating interlayer 132 and the etch stop layer 130.

Alternatively, only a small upper portion of the second insulating interlayer 132 overlapping the third hard masks 126 may be planarized so that the etch stop layer 130 may not be exposed. In this case, the third insulating interlayer 134 may not be formed.

Figure 16:
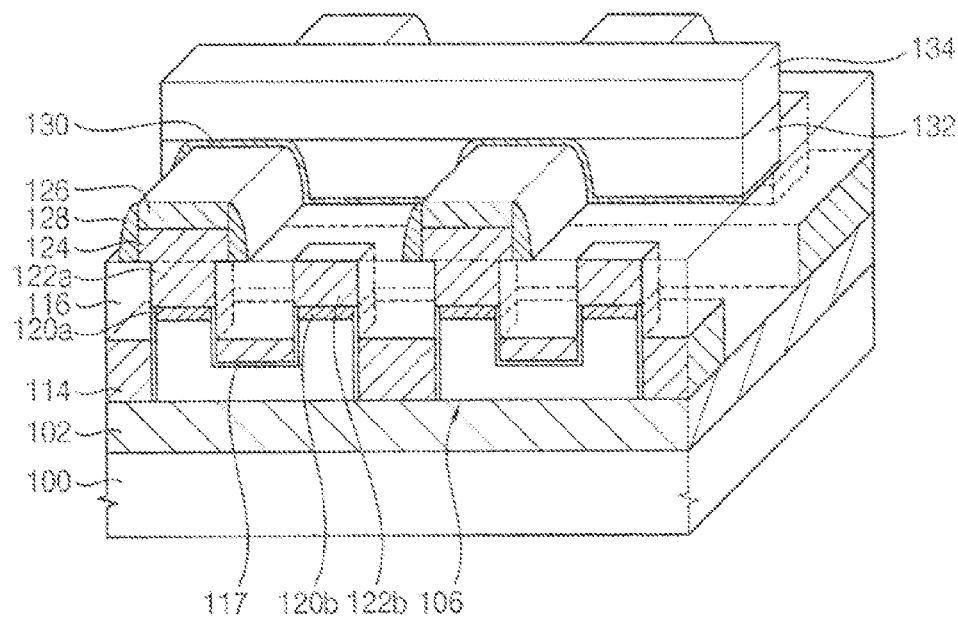

Referring to FIG. 16, a photoresist layer (not shown) may be foamed on the third insulating interlayer 134. The photoresist layer may be patterned to form a third photoresist pattern (not shown) extending in the first direction.

The third and second insulating interlayers 134, 132 may be etched using the third photoresist pattern as an etching mask, thereby exposing portions of the etch stop layer 130 over the active patterns 106. The exposed portions of the etch stop layer 130 may be removed.

Figure 17:
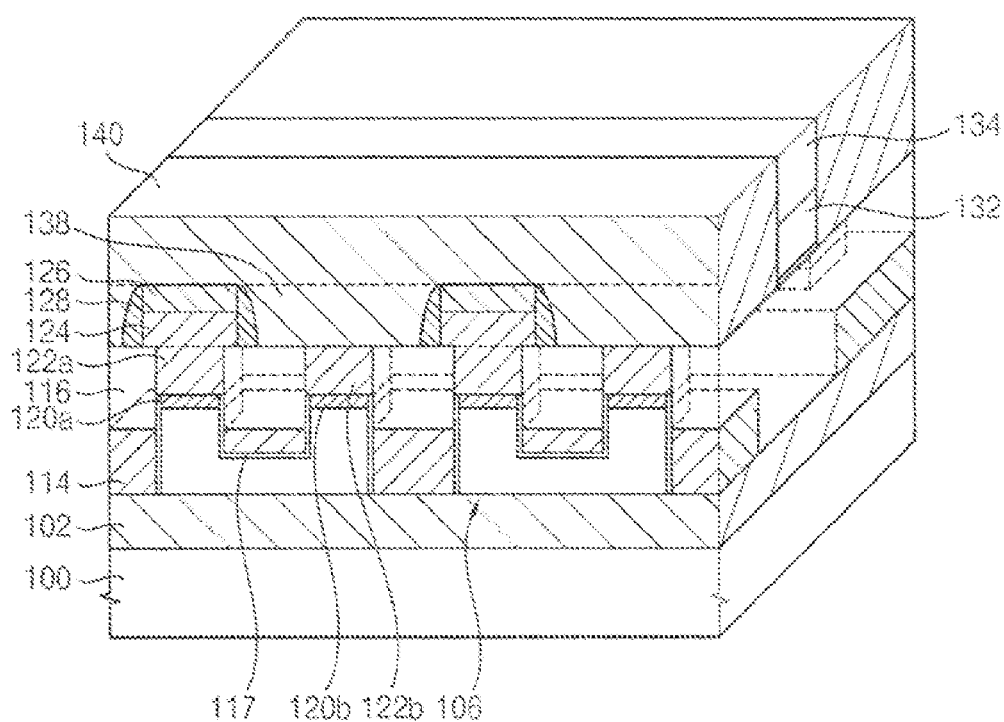

Referring to FIG. 17, a second conductive layer may be formed on the first insulating interlayer 116 and the first and second contact plugs 122a, 122b to cover the third hard masks 126 and the spacers 128. In an exemplary embodiment, the second conductive layer may be formed to have a height larger than that of the third insulating interlayer 134, thereby covering the third insulating interlayer 134. An upper portion of the second conductive layer may be planarized until the third insulating interlayer 134 is exposed. The second conductive layer may be formed using a metal.

Portions of the second conductive layer filling the spaces between the spacers 130 and contacting the second contact plugs 122b may serve as source contact plugs 138. The other portions of the second conductive layer formed on the source contact plugs 138 and the third hard masks 126 may serve as source lines 140. Each of the source lines 140 may extend in the first direction. The source lines 140 may be electrically insulated from each other by the second and third insulating interlayers 132, 134.

The source contact plugs 138 and the source lines 140 may be formed not by an etching process but by a damascene process. Additionally, the source contact plugs 138 are formed by a self-alignment process, thereby preventing misalignment of the source contact plugs 138 and the source lines 140.

A protection layer (not shown) may be further formed on the source lines 140 and the third insulating interlayer 134.

According to an exemplary embodiment, the area of the gate electrode facing the active pattern may be large because of the protrusions and the recess of the active pattern. Thus, the memory device having the active pattern has improved capacitance characteristics. Additionally, the volume of the active pattern may be easily controlled by varying the width and/or depth of the protrusions, and thus the memory device has good data retention characteristics.

The foregoing is illustrative of exemplary embodiments and is not to be construed as limiting thereof. Although practical exemplary embodiments have been described, those skilled in the art will readily appreciate that many modifications are possible in the exemplary embodiments without materially departing from the novel teachings and advantages of the present inventive concept. Accordingly, the exemplary embodiments described herein, all such modifications, as well as other exemplary embodiments, are intended to be included within the scope of the appended claims.

What is claimed is:

1. A memory device, comprising:
an insulation layer on a substrate;
an active pattern on the insulation layer, the active pattern including two protrusions and a recess between the protrusions, the active pattern including: a first impurity region and a second impurity region at upper portions of the protrusions distal from the substrate, respectively; and
a base region at other portions of the active pattern, the base region serving as a floating body for storing data;
a gate insulation layer on a surface of the active pattern; and
a gate electrode on the gate insulation layer, the gate electrode surrounding a lower portion of the active pattern and partially filling the recess,
wherein:
the base region serves as a base of a single bipolar transistor,
the first impurity region serves as an emitter of the single bipolar transistor,
the second impurity region serves as a collector of the single bipolar transistor, and
the gate electrode surrounding the lower portion of the active pattern and partially filling the recess serves as a gate electrode of the single bipolar transistor.

2. The memory device of claim 1, wherein the first impurity region and the second impurity region are doped with first conductive type impurities and the base region is doped with second conductive type impurities.

3. The memory device of claim 1, wherein a first voltage is applied to the base region via the gate electrode and a second voltage is applied to the second impurity region to store data in the base region.

4. The memory device of claim 3, wherein an erase voltage is applied to the base region via the gate electrode and a second voltage is applied to the second impurity region to erase data stored in the base region.

5. The memory device of claim 1, wherein a first voltage is applied to the base region via the gate electrode and a second voltage is applied to the second impurity region to store data in the base region, and wherein current flowing through the second impurity region serving as a collector is detected to read data stored in the base region.

6. The memory device of claim 1, wherein the gate electrode has a top surface closer to the substrate than bottoms of the first impurity region and the second impurity region are to the substrate.

7. The memory device of claim 1, wherein the active pattern includes a single crystalline semiconductor.

8. The memory device of claim 1, wherein a plurality of the active patterns is formed on the insulation layer, and wherein the gate electrode surrounds lower portions of the active patterns disposed in a first direction.

9. The memory device of claim 8, further comprising a bit line electrically connected to a plurality of the first impurity regions disposed in a second direction perpendicular to the first direction.

10. The memory device of claim 9, further comprising a source line electrically connected to a plurality of the second impurity regions disposed in the first direction.

11. The memory device of claim 10, further comprising a word line electrically connected to a plurality of base regions disposed in the first direction.

* * * * *